(12) United States Patent  
Braunisch et al.

(10) Patent No.: US 9,711,428 B2
(45) Date of Patent: Jul. 18, 2017

(54) DUAL-SIDED DIE PACKAGES

(71) Applicant: Intel Corporation, Santa Clara, CA (US)

(72) Inventors: Henning Braunisch, Phoenix, AZ (US); Feras Eid, Chandler, AZ (US); Adel A. Elsherbini, Chandler, AZ (US); Johanna M. Swan, Scottsdale, AZ (US); Don W. Nelson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/914,998

(22) PCT Filed: Sep. 27, 2013

(86) PCT No.: PCT/US2013/062471
§ 371 (c)(1),
(2) Date: Feb. 26, 2016

(87) PCT Pub. No.: WO2015/047350
PCT Pub. Date: Apr. 2, 2015

(65) Prior Publication Data
US 2016/0211190 A1 Jul. 21, 2016

(51) Int. Cl.
H01L 23/367 (2006.01)
H01L 21/52 (2006.01)
(Continued)

(52) U.S. Cl.
CPC .......... *H01L 23/3675* (2013.01); *H01L 21/52* (2013.01); *H01L 23/367* (2013.01);
(Continued)

(58) Field of Classification Search
CPC . B23K 35/0244; B23K 26/3206; H01L 24/14; H01L 24/11; H01L 24/81;
(Continued)

(56) References Cited

U.S. PATENT DOCUMENTS 5,519,176 A 5/1996 Goodman et al.
6,873,032 B1 3/2005 McCann et al.
(Continued)

FOREIGN PATENT DOCUMENTS

JP H11340396 12/1999
JP 2002170906 12/2000
(Continued)

OTHER PUBLICATIONS

Intel Corporation, "International Preliminary Report on Patentability", PCT/US2013/062471, (Apr. 7, 2016).
(Continued)

*Primary Examiner* — Roy Potter
(74) *Attorney, Agent, or Firm* — Blakely, Sokoloff, Taylor & Zafman LLP

(57) ABSTRACT

An apparatus including a die, a first side of the die including a first type of system level contact points and a second side including a second type of contact points; and a package substrate coupled to the die and the second side of the die. An apparatus including a die, a first side of the die including a plurality of system level logic contact points and a second side including a second plurality of system level power contact points. A method including coupling one of a first type of system level contact points on a first side of a die and a second type of system level contact points on a second side of the die to a package substrate.

19 Claims, 5 Drawing Sheets

(51) Int. Cl.
*H01L 23/473* (2006.01)
*H01L 23/498* (2006.01)

(52) U.S. Cl.
CPC ...... *H01L 23/473* (2013.01); *H01L 23/49811* (2013.01); *H01L 23/49833* (2013.01); *H01L 23/49838* (2013.01); *H01L 2924/0002* (2013.01)

(58) Field of Classification Search
CPC ............. H01L 2924/14; H01L 23/3675; H01L 2224/1405; H01L 2224/81825; H01L 23/49838; H01L 23/49833; H01L 23/49811; H01L 21/52; H01L 23/473; H01L 23/367; H01L 2924/0002; H05K 3/341; H05K 1/115; H05K 1/144; H05K 2201/09572
See application file for complete search history.

(56) References Cited

U.S. PATENT DOCUMENTS

| | | |
|---|---|---|
| 2004/0178484 A1 | 9/2004 | Burdick, Jr. et al. |
| 2007/0090517 A1 | 4/2007 | Moon et al. |
| 2007/0152313 A1 | 7/2007 | Periaman et al. |
| 2010/0252934 A1 | 10/2010 | Law et al. |
| 2012/0043127 A1 | 2/2012 | Lin et al. |
| 2014/0097536 A1* | 4/2014 | Schunk ............. H01L 31/02325 257/738 |

FOREIGN PATENT DOCUMENTS

| | | |
|---|---|---|
| JP | 2004064093 | 7/2002 |
| JP | 2012009717 | 1/2012 |
| KR | 1020110030766 | 3/2011 |
| WO | WO-0069236 | 11/2000 |
| WO | WO-2013101242 | 7/2013 |

OTHER PUBLICATIONS

Intel Corporation, Search Report for International Application No. PCT/US2013/062471 (Jun. 30, 2014).

Intel Corporation, "Non final office action", JP Application No. 2016-541946, (Apr. 4, 2017).

Intel Corporation, "Supplementary EP Search Report", EP Application No. 13894646.2, (Mar. 31, 2017).

\* cited by examiner

DUAL-SIDED DIE PACKAGES

CROSS-REFERENCE TO RELATED APPLICATION

This patent application is a U.S. National Phase Application under 35 U.S.C. §371 of International Application No. PCT/US2013/062471, filed Sep. 27, 2013, entitled DUAL-SIDED DIE PACKAGES.

TECHNICAL FIELD

Integrated circuit packaging.

BACKGROUND

Advanced semiconductor device scaling is expected to lead to architectures involving die stacking. Die-on-die stacking presents issues for routing of electrical connections or contact points, including general purpose electrical connections, also referred to herein as system level connections. At the same time, many high performance devices such as central processing units (CPUs) need to be provided with a thermal solution to remove heat from the device.

DETAILED DESCRIPTION

The embodiments described herein include configurations that segregate or decouple system level contacts or contact points on opposite sides of a die. System level connections, contacts or contact points as described herein are connections that connect the die to a system, whether that system be a motherboard, a daughter card or higher level module. Representatively described herein as examples of system level connections (contacts or contact points) are power and logic input/output connections. System level connections may be distinguished from connections directed at private interfaces such as memory I/O connections to a logic die where such connections form an interface between the logic die and the memory die internal to a package. Such a private interface is not directly connected to the rest of the system in which the package is located. In the embodiments that follow, segregation of system level connections that are power and logic I/O connections (contacts or contact points) is described. It is appreciated, however, that segregation of other system level connections (contacts or contact points) will follow a similar strategy. Specifically, the configurations described herein show segregation of power delivery and logic I/O to opposite sides of a die. Such segregation may include a complete segregation (i.e., all power connections are on one side of a die and all I/O connections are on an opposite side of a die) or less than complete segregation (e.g., some I/O connections are disposed on a side of a die with power connections or other I/O connections (e.g., faster signal connections) are disposed on an opposite side).

Figure 1:
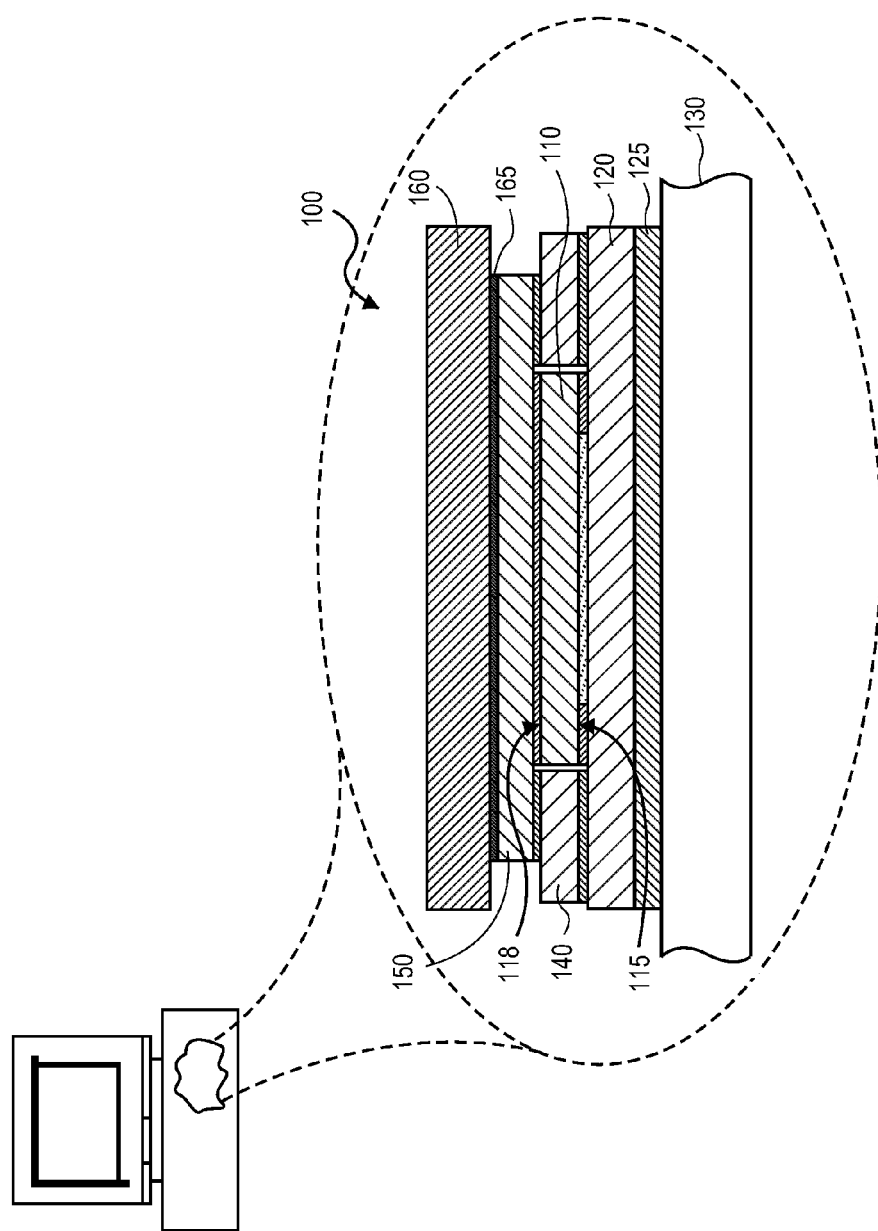
FIG. 1 shows a side view of a system including a package substrate mounted to a motherboard wherein the package substrate contains a die having I/O contact points on a device side and power contact points on a back side and a thermal solution on the back side.

Referring to the figures, FIG. 1 shows a side view of a portion of a system that might be present in, for example, a computer or server. Referring to FIG. 1, system 100 or a semiconductor device assembly includes die 110 that is, for example, a central processing unit (CPU) die having device side 115 and opposite or back side 118. In this embodiment, power and logic I/O connections (contact points) are segregated such that the I/O contact points are on device side 115 and power contact points are disposed on back side 118. As used herein, a die can have a single device layer or multiple stacked device layers. One way of disposing power contact points on back side 118 is by routing the associated lines from device side 115 to back side 118 of die 110 through through-silicon vias (TSVs) of die 110. CPU die 110 is connected to package substrate 120. Logic I/O contact points may be connected to package substrate 120 in a flip chip configuration. Package substrate 120 is connected to motherboard 130. In one embodiment, the connection 125 between package substrate 120 and motherboard 130 is through a ball grid array (BGA) interface or socket interface, such as a land grid array (LGA) socket or pin grid array (PGA) socket.

As described above, power contact points are disposed on back side 118 of die 110. Power needs to be brought from motherboard 130 through package substrate 120 to the power connections or contact points on back side 118 of die 110. In one embodiment, system 100 includes interposer 140 disposed on package substrate 120 and surrounding at least a portion of die 110 in a coplanar arrangement. Overlying die 110 and a portion of interposer 140, in one embodiment, is 3D voltage regulator 150. 3D voltage regulator 150 is mounted on back side 118 of die 110 and includes connections with interposer 140 and power contact points on back side 118. One such connection is a solder connection. For thermal management, 3D voltage regulator 150 includes, in one embodiment, a thermoelectric cooling device for removing heat from die 110 through the power delivery interface. Overlying 3D voltage regulator 150, in this embodiment, is heat exchanger 160 that is, for example, an integrated heat spreader (IHS). In one embodiment, heat exchanger 160 is mounted on 3D voltage regulator 150 with thermal interface material 165 therebetween. Heat exchanger 160, for example, an IHS, may be coupled to a heat sink (not shown).

Figure 2A:
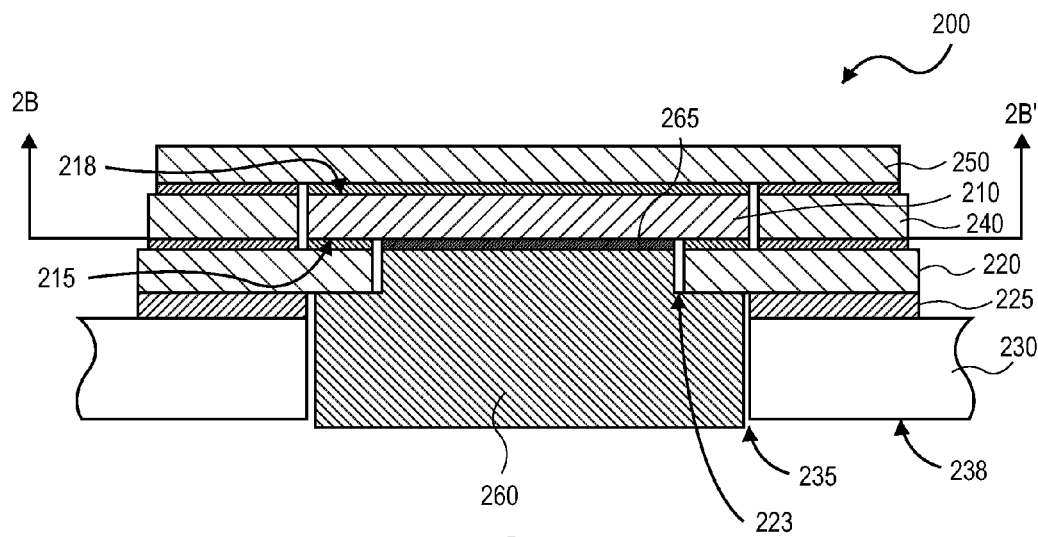
FIG. 2A shows a second embodiment of a system wherein the die of the system has I/O contact points on a device side and power contact points on a back side and the system has a thermal solution on a device side of the die.
Figure 2B:
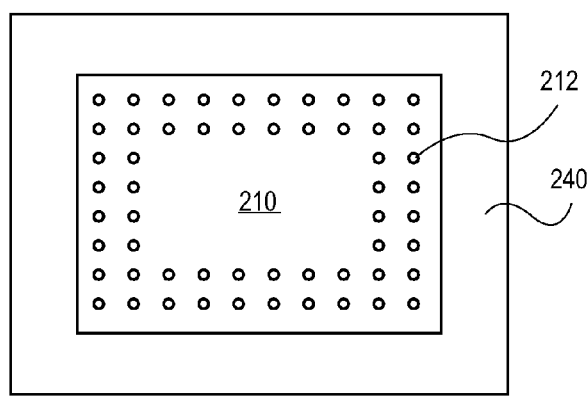
FIG. 2B shows the structure of FIG. 2A through line 2b-2b'.

FIG. 2A shows a second embodiment of a system. In this embodiment, a dual-sided die package is described with power on a back side of a die, logic I/O on a device side of the die and a thermal solution also on a device side of the die. Referring to FIG. 2A, system 200 includes die 210 that is, for example, a CPU die including device side 215 and back side 218 opposite device side 215. Die 210 is connected to package substrate 220 through, for example, a flip chip configuration wherein, for example, all of the logic I/O contact points are disposed on a periphery of die 210 leaving an interior of die 210 available for bonding to a heat exchanger (e.g., an IHS). FIG. 2B shows the structure of FIG. 2A through line 2b-2b' and shows I/O contact points 212 disposed about a periphery of device side 215 of die 210.

Package substrate 220 is connected to motherboard 230 through interface 225 that is, for example, a BGA interface or a socket interface. In this embodiment, motherboard 230 includes opening 235 completely through the motherboard. Opening 235 is sized to accommodate an IHS. FIG. 2A shows IHS 260 disposed through opening 235 in motherboard 230. In one embodiment, package substrate 220 also includes an opening completely through a body of a package substrate. Thus, as illustrated, IHS 260 is disposed in opening 235 of motherboard 230 and opening 223 of package substrate 220. In this manner, IHS 260 may be connected to a device side of die 210 through, for example, thermal interface material 265. By disposing IHS 260 on device side 215 of die 210, the IHS is exposed to heat removal at a secondary side of motherboard 230 (e.g., a heat sink or the heat removal device may be positioned or deployed at side 238 (a side opposite a side of motherboard 230 including connections for devices)). The heat removal device may be, for example, a heat sink or a fan. Representatively, if system 200 is positioned vertically with respect to another back plane or mid plane, a fan may be useful for heat removal.

Referring now to back side 218 of die 210, FIG. 2A shows power delivery for die 210 is made through interposer 240 surrounding at least a portion of die 210 in a coplanar arrangement. Overlying interposer 240 is power delivery multilayer substrate 250. Power delivery multilayer substrate 250 is, for example, a structure of several layers (e.g., four layers) of a conductive material such as copper, a number of layers targeted to reduce lateral parasitics (resistance and inductance). Power delivery multilayer substrate 250 may be connected to power contact points on back side 218 of die 210 and to interposer 240 through, for example, solder connections. Power delivery multilayer substrate 250 may also serve as a substrate for other power delivery related discrete components, such as capacitors and inductors on a surface thereof (e.g., a surface of power delivery multilayer substrate 250 opposite die 210).

Figure 3:
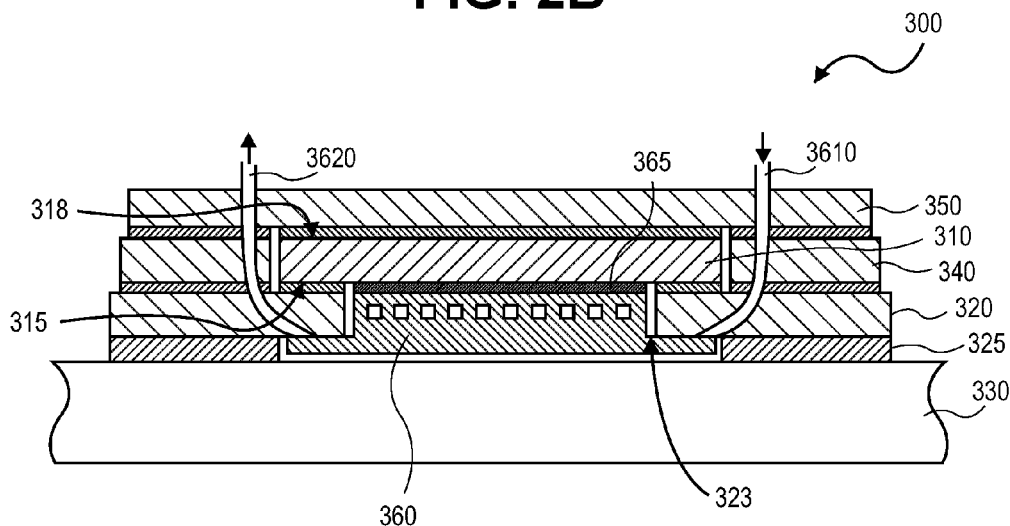
FIG. 3 shows a third embodiment of a system wherein the die of the system has I/O contact points on a device side and power contact points on a back side and the system has a thermal solution on a device side of the die and the thermal solution utilizes micro-channel cooling.

FIG. 3 shows a third embodiment of a system. System 300 is similar to system 200 illustrated in FIG. 2A regarding a dual-sided die package with power on a back side 318 of a die, and logic I/O and a thermal solution on a device side 315 of the die. Unlike the system shown in FIG. 2A, the heat exchanger or heat solution is not disposed through an opening in a motherboard of the system. Referring to FIG. 3, system 300 includes die 310 of, for example, a CPU. Die 310 is connected to package substrate 320 through a flip chip configuration. Similar to system 200, in one embodiment, I/O contacts are disposed on device side 315 of die 310 representatively about a periphery of device side 315 of die 310 leaving an area in the center of die 310 on device side 315 exposed for connection to an IHS. Package substrate 320 is connected to motherboard 330 through interface 325, for example, a ball grid array interface or a socket interface.

In the embodiment shown in FIG. 3, package substrate 320 has an opening therethrough. Opening 323 is sized to accommodate a portion of an IHS. FIG. 3 shows IHS 360 disposed within opening 323 in package substrate 320 and connected to a device side of die 310 through, for example, thermal interface material 365. In this embodiment, IHS 360 incorporates micro-channel cooling (MCC), e.g., liquid cooling. In the embodiment employing liquid cooling, in one embodiment, a liquid is supplied/removed to IHS 360. One way liquid may be supplied/removed to IHS 360 is through a conduit system. FIG. 3 shows inlet conduit 3610 intended to bring fluid to IHS 360. Inlet conduit 3610 is accessible at a surface of power delivery multilayer substrate 350 and extends through power delivery multilayer substrate 350, through interposer 340 and through at least a portion of package substrate 320 to IHS 360. Similarly, system 300 also includes outlet conduit 3620. As illustrated, outlet conduit 3620 extends from IHS 360 through at least a portion of package substrate 320, through interposer 340 and through power delivery multilayer substrate 350. Outlet conduit 3620 is accessible on or near a surface of power delivery multilayer substrate 350 to allow the fluid to be removed or recirculated through the system. In one embodiment, only one inlet (inlet 3610) and one outlet (outlet 3620) are needed. Inlet conduit 3610 may feed a manifold in IHS 360 to distribute fluid through the IHS. A microchannel cooling system 300 may be suitable for a server market segment where deployment of a liquid cooling infrastructure can be an effective solution, e.g., in data centers or high-performance computing (HPC) installations.

Figure 4A:
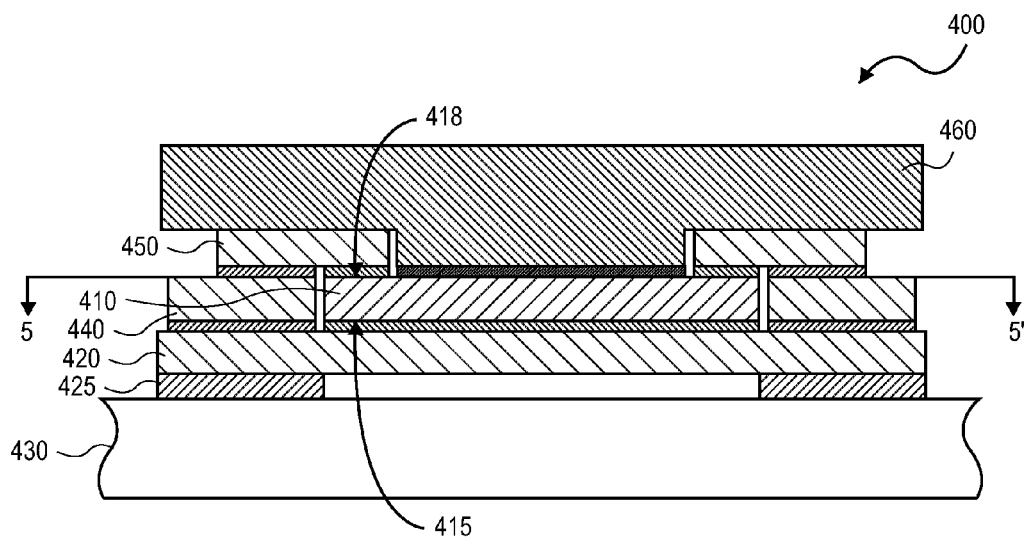
FIG. 4A shows a fourth embodiment of a system wherein the die has power contact points on a device side and I/O contact points on a back side and the system has a thermal solution on the die back side.
Figure 4B:
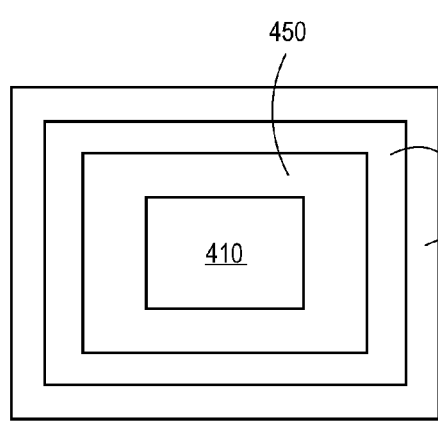
FIG. 4B shows an embodiment of system of FIG. 4A through line 5-5' and shows an I/O bridge as a single structure.
Figure 4C:
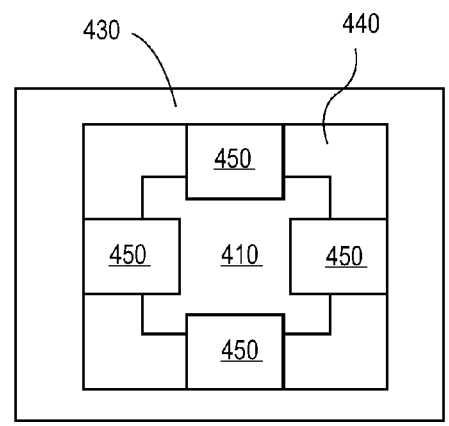
FIG. 4C shows another embodiment through line 5-5' of FIG. 4A where an I/O bridge is defined by multiple structures.

FIG. 4A shows another embodiment of a dual-sided die package system. In this embodiment, the dual-sided die package system configuration includes power contact points on a device side 415 of the die, logic I/O contact points on a back side 418 of a die and the thermal solution or management also on the back side 418 of the die. Referring to FIG. 4A, system 400 includes die 410 of, for example, a CPU die having device side 415 including power contact points. Back side 418 of die 410 includes logic I/O contact points. Die 410 is connected to package substrate 420 through, for example, a flip chip configuration. Package substrate 420 is connected to motherboard 430 through, for example, interface 425 that is, for example, a BGA interface or a socket interface. To connect the logic I/O contacts on back side 418 of die 410 to the system, system 400 utilizes interposer 440 and I/O bridge 450. Surrounding at least a portion of die 410 in a coplanar arrangement and connected to package substrate 420 is interposer 440. Disposed on interposer 440 is I/O bridge 450. I/O bridge 450 is, for example, an organic substrate containing traces that form connections between interposer 440 and I/O contact points disposed around a periphery of back side 418 of die 410. In one embodiment, I/O bridge 450 is a single structure such as a frame like configuration having an opening therethrough to expose a portion of back side 418 of die 410. In another embodiment, I/O bridge 450 may be multiple bridges. FIG. 4B shows an embodiment of system 400 through line 5-5' and illustrates I/O bridge 450 as a single structure (a frame) having an opening to expose a portion (a central portion) of die 410. FIG. 4C shows another embodiment through line 5-5' of FIG. 4A where I/O bridge 450 is defined by multiple structures (multiple bridges). I/O bridge 450 is connected to I/O contact points on back side 418 of die 410 and also to interposer 440 through, for example, solder connection. The I/O bridge connection allows routing of I/O signals from back side 418 of die 410 to package substrate 420 and thus to motherboard 430.

FIG. 4A also shows IHS 460 connected to back side 418 of die 410 through, for example, a thermal interface material.

Figure 5:
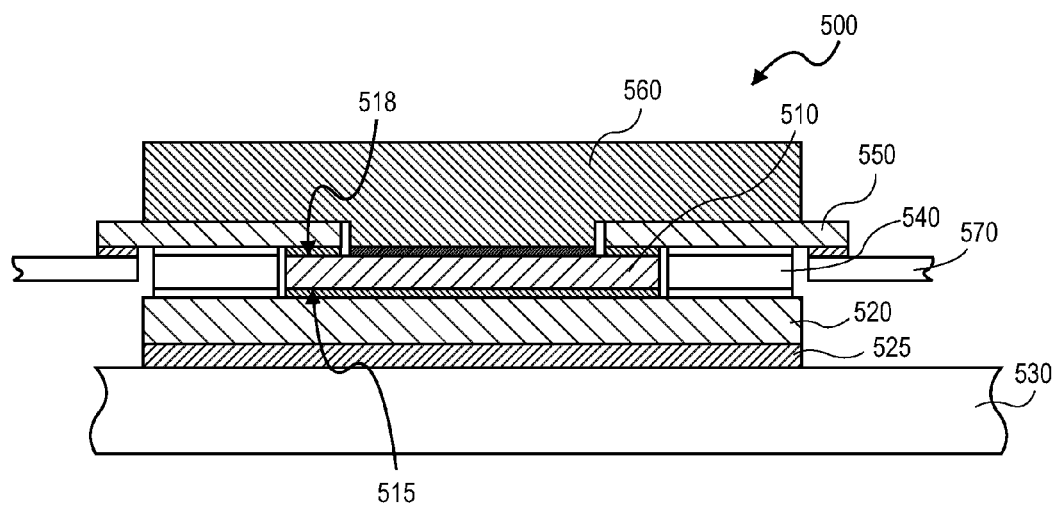
FIG. 5 shows a fifth embodiment of a system wherein the die of the system has power contact points on a device side and I/O contact points on a back side and the system has a thermal solution on the back side of the die.

FIG. 5 shows another embodiment of a system that includes a dual-sided die package where power contact points are disposed on a device side 515 of a die, logic I/O contact points are disposed on a back side 518 of the die and thermal management is also on a back side 518. Referring to FIG. 5, system 500 is similar to system 400 in FIG. 4A in that die 510 (a CPU) is connected at device side 515 to package substrate 520 through, for example, a flip chip configuration. Package substrate 520 is connected to motherboard 530 through interface 525, for example, a BGA interface or a socket interface. I/O signals are routed between package substrate 520 and motherboard 530 to I/O contact points on back side 518 of die 510. Disposed on a surface of package substrate 520 and surrounding a portion including an entire portion of die 510 in a coplanar arrangement is spacer 540 of, for example, a dielectric material (e.g., an organic material frame).

In the embodiment shown in FIG. 5, logic I/O connections (e.g., contact points) are disposed on back side 518 of die 510. Such connections are routed to/from back side 518 of die 510 by I/O paddle 550. In one embodiment, I/O contact points are disposed around a periphery of back side 518 of die 510. I/O paddle 550 which may be one integrated structure or a number of individual structures similar to I/O bridge 450 in the system of FIG. 4A, is connected to such contact points by, for example, solder connections. I/O paddle 550 includes conductive lines to route signals to and from I/O contact points to I/O cable 570. In addition to a connection to I/O paddle 550, I/O cable 570 is also connected to package substrate 520 or motherboard 530. The use of I/O cable 570 allows for high speed signaling. I/O cable 570 is, for example, a flex-circuit or micro-coax cable. Accordingly, system 500, in one embodiment, is compatible with high-speed signaling standards such as future generations of Peripheral Component Interconnect Express (PCIe) and Host Fabric Interface (HFI) expected to run at speeds of 16 gigabits per second and beyond.

In one embodiment, the system level I/O contact points on back side 518 of die 510 are a first portion of I/O contact points associated with die 510. A second portion of I/O contact points, such as for example, lower-speed I/Os such as those associated with double data rate (DDR) memory buses may be disposed on device side 515 of die 510 along with, as noted above, power connections or contact points. In this manner, the second portion of I/O contact points (e.g., lower speed) may be routed through package substrate 520 making contact at device side 515 of die 510 that is also the side for power delivery. Similar apportionment of I/O contact points may be employed in any of the embodiments described herein (e.g., in any of the systems shown in FIGS. 1-5). Similarly, power contact points may also be apportioned between the device and back side of a die.

FIG. 5 also shows IHS 560 connected to back side 518 of die 510 through, for example, a thermal interface material.

Figure 6:
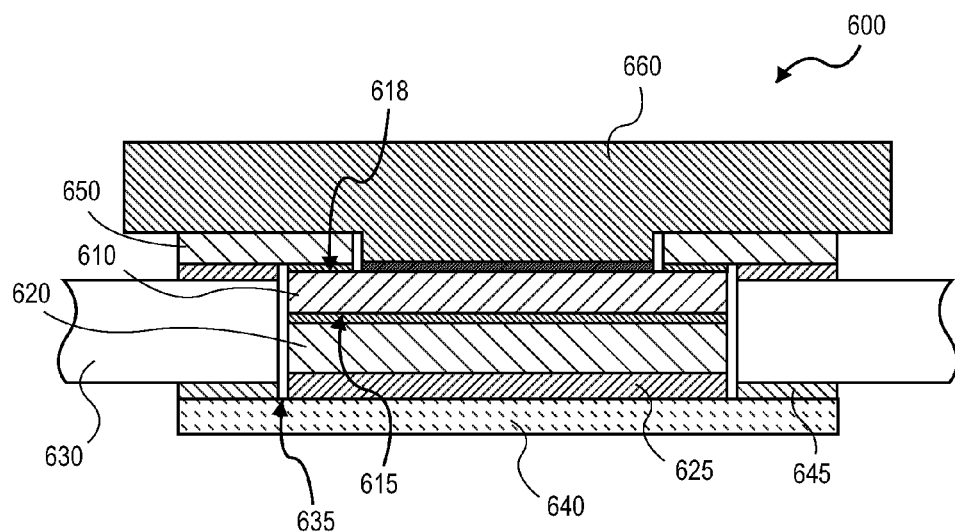
FIG. 6 shows a sixth embodiment of a system wherein the die of the system has power contact points on a device side and I/O contact points on a back side and the system has a thermal solution on the back side of the die.

FIG. 6 shows another embodiment of a system that includes a dual-sided die package including power connections or contact points on a device side of a die and logic I/O contact points on a back side of the die. A thermal solution is also disposed on a back side of the die. Referring to FIG. 6, system 600 includes die 610 including device side 615 and back side 618. In one embodiment, power connections or contact points are disposed on device side 615 and I/O connections or contact points are disposed on back side 618 of die 610. Die 610 is connected on device side 615 to package substrate 620 through, for example, a flip chip configuration. Package substrate 620 including at least a portion of die 610 is disposed within an opening of motherboard 630. Thus, motherboard 630 has opening 635 suitable to accommodate package substrate 620 and die 610. Package substrate 620 is connected to motherboard 630 through a power delivery socket board 640. Power delivery socket board 640 is, for example, a board having connections to connect to contact points of package substrate 620 through, for example, a compliant socket connection (connection 625) and route signals and connect to motherboard 630 through, for example, a solder connection (connection 645). In one embodiment, package substrate 620 including die 610 is assembled and connected to power delivery socket board 640 through socket connection 625. The assembled package is inserted into opening 635 of motherboard 630 such that a mechanically compliant connection is made between power delivery socket board 640 and package substrate 620. As illustrated in FIG. 6, certain I/O connections (e.g., high speed I/O connection) on back side 618 of die 610 are connected to I/O bridge 650 that is a single structure, such as a frame surrounding the die, or multiple structures. A connection between I/O contact points and connections of I/O bridge 650 may be through a solder connection. I/O bridge 650 includes traces allowing routing of the I/O signals between motherboard 630 and die 610. In one embodiment, the I/O connections between motherboard 630 and I/O bridge 650 are optimized for high-frequency operation (e.g., a high-speed socket connection) resulting in a clean I/O signaling path between die 610 and motherboard 630 with a minimum of vertical discontinuities such as vias.

FIG. 6 also shows IHS 660 connected to back side 618 of die 610 through, for example, a thermal interface material.

In the embodiment described above, certain structures, interposers, bridges, paddles, etc. are described. Such structures may include routing layers or lines (e.g., traces) disposed within dielectric material. It is appreciated that techniques for forming such structures are known and include embedding techniques such as bumpless buildup layer (BBUL), embedded wafer level BGA (eWLB), and embedded array capacitor (EAC) packaging.

Figure 7:
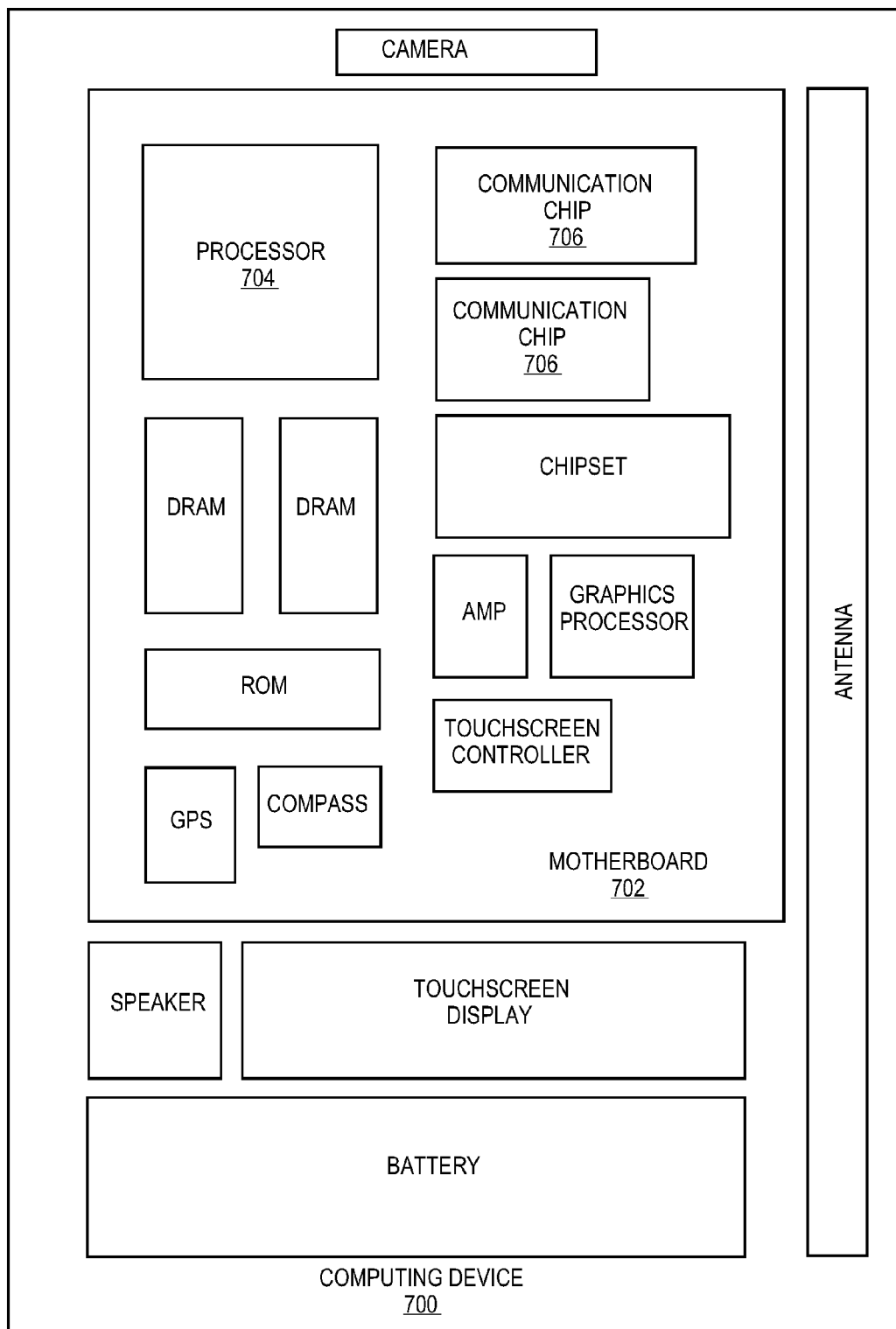
FIG. 7 illustrates a computing device in accordance with one implementation.

FIG. 7 illustrates a computing device 700 in accordance with one implementation. Computing device 700 houses board 702. Board 702 may include a number of components, including but not limited to one or more processor chip 704 and at least one communication chip 706. Processor 704 is physically and electrically coupled to board 702. In some implementations at least one communication chip 706 is also physically and electrically coupled to board 702. In further implementations, communication chip 706 is part of processor 704.

Depending on its applications, computing device 700 may include other components that may or may not be physically and electrically coupled to board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, first communication chip 706 may be dedicated to shorter range wireless communications such as Wi-Fi and Bluetooth and second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. In some implementations of the invention, the integrated circuit die of the processor includes one or more devices, such as MOSFET transistors built in accordance with implementations of the invention. The term "processor" may refer to any device or portion of a device that processes electronic data from registers and/or memory to transform that electronic data into other electronic data that may be stored in registers and/or memory.

Communication chip 706 also includes an integrated circuit die packaged within communication chip 706. In accordance with another implementation of the invention, the integrated circuit die of the communication chip includes one or more devices, such as MOSFET transistors built in accordance with implementations of the invention.

In further implementations, another component housed within computing device 700 may contain an integrated circuit die that includes one or more devices, such as MOSFET transistors built in accordance with implementations of the invention.

In various implementations, computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 700 may be any other electronic device that processes data.

EXAMPLES

Example 1 is a semiconductor device assembly apparatus including a die including a first side and an opposite second side, the first side including a first type of system level contact points and the second side including a second type of system level contact points; and a package substrate coupled to one of the first side of the die and the second side of the die.

In Example 2, the first type of system level contact points in the apparatus of Example 1 include logic input/output contact points.

In Example 3, the second type of system level contact points in the apparatus of Example 1 include power contact points.

In Example 4, the apparatus of Example 1 includes a heat exchanger coupled to one of the first side of the die and the second side of the die and the package substrate and the heat exchanger are coupled on the same side of the die.

In Example 5, the apparatus of Example 1 includes a heat exchanger coupled to one of the first side of the die and the second side of the die and the package substrate and the heat exchanger are coupled on opposite sides of the die.

In Example 6, the package substrate of Example 2 is coupled to the second side of the die and ones of the logic input/output contact points are coupled to the package substrate through an interposer.

In Example 7, the package substrate of Example 2 is coupled to the second side of the die and ones of the logic input/output contact points are coupled to the package substrate through a cable.

In Example 8, the ones of the logic input/output contact points in Example 7 include a first plurality of logic input/output contact points, the apparatus including a second plurality of logic input/output contact points disposed on the second side of the die.

In Example 9, the signals associated with the first plurality of logic input/output contact points in Example 8 are faster than signals associated with the second plurality of logic input/output contact points.

In Example 10, the apparatus of Example 1 includes a system board and the package substrate is coupled to the system board.

In Example 11, the apparatus of Example 1 includes a heat exchanger coupled to one of the first side of the die and the second side of the die and the system board has an opening and one of the package substrate and the heat exchanger is disposed in the opening.

Example 12 is a semiconductor device assembly apparatus including a die including a first side and a second side, the first side including a plurality of system level logic contact points and the second side including a second plurality of system level power contact points including a function different than the first plurality of system level contact points.

In Example 13, the apparatus of Example 12 includes a package substrate coupled to one of the first side of the die and the second side of the die, and when the package substrate is coupled to the second side of the die, the plurality of logic contact points are coupled to the package substrate through one of an interposer and a cable.

In Example 14, the package substrate in the apparatus of Example 13 is coupled to the second side of the die and the logic contact points include a first plurality of logic contact points, the apparatus further including a second plurality of logic input/output contact points disposed on the second side of the die.

In Example 15, the apparatus of Example 13 includes a system board, and the package substrate is coupled to the system board.

In Example 16, the apparatus of Example 15 includes a heat exchanger coupled to one of the first side of the die and the second side of the die, and the system board has an opening and one of the package substrate and the heat exchanger is disposed in the opening.

Example 17 is a method of forming an assembly apparatus including coupling one of a first type of system level contact points on a first side of a die and a second type of system level contact points on a second side of the die to a package substrate.

In Example 18, the method of Example 17 includes coupling one of the first type of system level contact points and the second type of system level contract points to a heat exchanger, and the package substrate and the heat exchanger are coupled on opposite sides of the die.

In Example 19, the method of Example 17 includes coupling the package substrate to a system board.

In Example 20, the method of Example 19 includes coupling one of the first type of system level contact points and the second type of system level contract points to a heat exchanger, and the system board has an opening and one of the package substrate and the heat exchanger is disposed in the opening.

Example 21 is a processor system formed by any of the methods of Examples 17-20.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A semiconductor device assembly apparatus comprising:
    a die comprising a first side and an opposite second side, the first side comprising a first type of system level contact points and the second side comprising a second type of system level contact points,
    wherein the first type of system level contact points comprise logic input/output contact points and the second type of system level contact points comprise power contact points; and
    a package substrate coupled to one of the first side of the die and the second side of the die.

2. The apparatus of claim 1, further comprising a heat exchanger coupled to one of the first side of the die and the second side of the die, wherein the package substrate and the heat exchanger are coupled on the same side of the die.

3. The apparatus of claim 1, further comprising a heat exchanger coupled to one of the first side of the die and the second side of the die, wherein the package substrate and the heat exchanger are coupled on opposite sides of the die.

4. The apparatus of claim 1, wherein the package substrate is coupled to the second side of the die and ones of the logic input/output contact points are coupled to the package substrate through an interposer.

5. The apparatus of claim 1, wherein the package substrate is coupled to the second side of the die and ones of the logic input/output contact points are coupled to the package substrate through a cable.

6. The apparatus of claim 5, wherein the ones of the logic input/output contact points comprise a first plurality of logic input/output contact points, the apparatus comprising a second plurality of logic input/output contact points disposed on the second side of the die.

7. The apparatus of claim 6, wherein signals associated with the first plurality of logic input/output contact points are faster than signals associated with the second plurality of logic input/output contact points.

8. The apparatus of claim 1, further comprising a system board, wherein the package substrate is coupled to the system board.

9. The apparatus of claim 1, further comprising a heat exchanger coupled to one of the first side of the die and the second side of the die, wherein the system board has an opening and one of the package substrate and the heat exchanger is disposed in the opening.

10. A semiconductor device assembly apparatus comprising:
    a die comprising a first side and a second side, the first side comprising a plurality of system level logic contact points and the second side comprising a second plurality of system level power contact points comprising a function different than the first plurality of system level contact points.

11. The apparatus of claim 10, further comprising a package substrate coupled to one of the first side of the die and the second side of the die, wherein when the package substrate is coupled to the second side of the die, the plurality of logic contact points are coupled to the package substrate through one of an interposer and a cable.

12. The apparatus of claim 11, wherein the package substrate is coupled to the second side of the die and the logic contact points comprise a first plurality of logic contact points, the apparatus further comprising a second plurality of logic input/output contact points disposed on the second side of the die.

13. The apparatus of claim 11, further comprising a system board, wherein the package substrate is coupled to the system board.

14. The apparatus of claim 13, further comprising a heat exchanger coupled to one of the first side of the die and the second side of the die, wherein the system board has an opening and one of the package substrate and the heat exchanger is disposed in the opening.

15. A method of forming an assembly apparatus comprising:
    coupling one of a first type of system level contact points on a first side of a die and a second type of system level contact points on a second side of the die to a package substrate, wherein the first type of system level contact points comprise logic input/output contact points and the second type of system level contact points comprise a different type of contact points than the first type of system level contact points.

16. The method of claim 15, further comprising coupling one of the first type of system level contact points and the second type of system level contact points to a heat exchanger and coupling the package substrate to a system board, wherein the package substrate and the heat exchanger are coupled on opposite sides of the die.

17. The method of claim 15, further comprising coupling the package to a system board.

18. The method of claim 17, further comprising coupling one of the first type of system level contact points and the second type of system level contact points to a heat exchanger, wherein the system board has an opening and one of the package substrate and the heat exchanger is disposed in the opening.

19. A processor system formed by the method of claim 15.

* * * * *